United States Patent
Ishibashi

(10) Patent No.: US 11,316,527 B2
(45) Date of Patent: Apr. 26, 2022

(54) AD CONVERTER

(71) Applicant: CANON KABUSHIKI KAISHA, Tokyo (JP)

(72) Inventor: Koji Ishibashi, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/718,903

(22) Filed: Dec. 18, 2019

(65) Prior Publication Data

US 2020/0204186 A1   Jun. 25, 2020

Related U.S. Application Data

(60) Provisional application No. 62/782,642, filed on Dec. 20, 2018.

(51) Int. Cl.
*H03M 1/58* (2006.01)
*H03M 1/36* (2006.01)
*G06N 3/063* (2006.01)
*G11C 13/00* (2006.01)

(52) U.S. Cl.
CPC .............. *H03M 1/36* (2013.01); *G06N 3/063* (2013.01); *G11C 13/003* (2013.01); *G11C 2213/72* (2013.01)

(58) Field of Classification Search
CPC .......... H03M 1/56; H03M 1/123; H03M 1/34; H03M 1/1023; H03M 1/1295; H03M 1/08; H03M 1/66; H03M 1/742; H03M 1/1014; H03M 1/0607; H03M 1/0678; H03M 1/0845; H03M 1/0863; H03M 1/12; H03M 1/0612; H03M 1/18; H04N 5/378; H04N 5/37455; H04N 5/374; H04N 5/357; H04N 5/3575; H04N 5/3658; H04N 5/235; H04N 5/335; H04N 5/365; H04N 5/347; H04N 5/363; H04N 5/3698; H04N 5/3742; H04N 5/3765
USPC ......................................... 341/155, 166–170
See application file for complete search history.

(56) References Cited

U.S. PATENT DOCUMENTS

| | | | |
|---|---|---|---|
| 5,714,903 A * | 2/1998 | Bruccoleri | G06G 7/163 327/359 |
| 5,861,829 A * | 1/1999 | Sutardja | H03M 1/1061 341/122 |
| 2012/0286138 A1* | 11/2012 | Yamazaki | H04N 5/3655 250/208.1 |
| 2018/0109744 A1* | 4/2018 | Hanzawa | H03M 1/0845 |
| 2019/0019081 A1* | 1/2019 | Kim | G11C 13/0007 |
| 2019/0082126 A1* | 3/2019 | Hisamatsu | H04N 5/374 |
| 2019/0104273 A1* | 4/2019 | Sato | H04N 5/37455 |
| 2019/0305792 A1* | 10/2019 | Hasegawa | H04N 5/374 |
| 2020/0020393 A1* | 1/2020 | Al-Shamma | G11C 16/08 |

(Continued)

FOREIGN PATENT DOCUMENTS

WO      2019096660 A1    5/2019

*Primary Examiner* — Linh V Nguyen
(74) *Attorney, Agent, or Firm* — Canon U.S.A., Inc. IP Division

(57) ABSTRACT

An analog to digital converter is provided and includes column processing units that convert analog signal to digital signal. One or more counters count time of analog to digital conversion and one or more comparators compares the voltage of reference signal and analog signal from neuromorphic device. One or more generators generates the reference signal for the comparator.

9 Claims, 10 Drawing Sheets

(56) References Cited

U.S. PATENT DOCUMENTS

2020/0053299 A1\* 2/2020 Zhang ................ H04N 5/23229
2020/0053308 A1\* 2/2020 Niwa ................... H04N 5/3537

\* cited by examiner

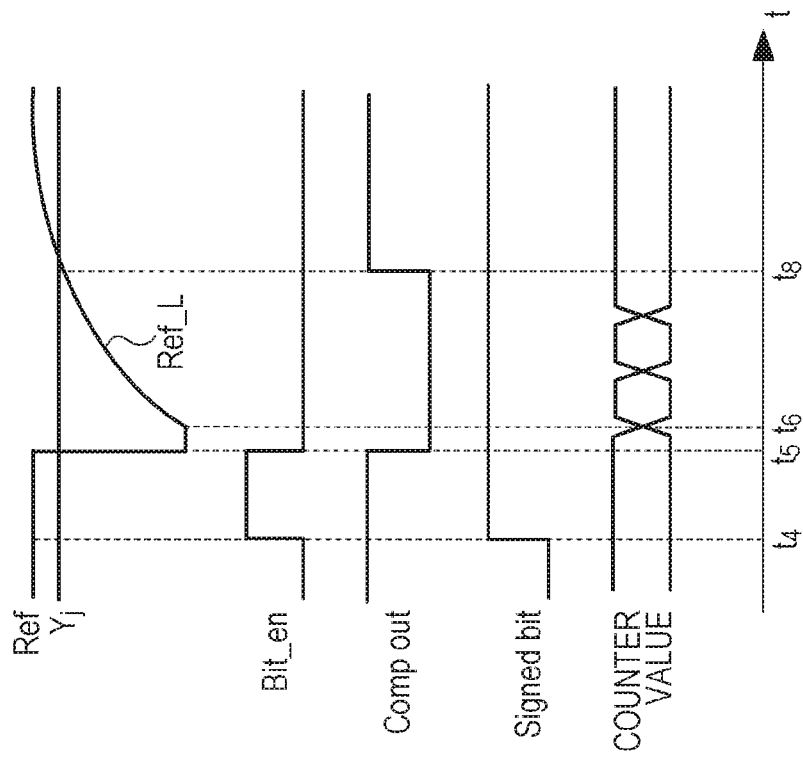
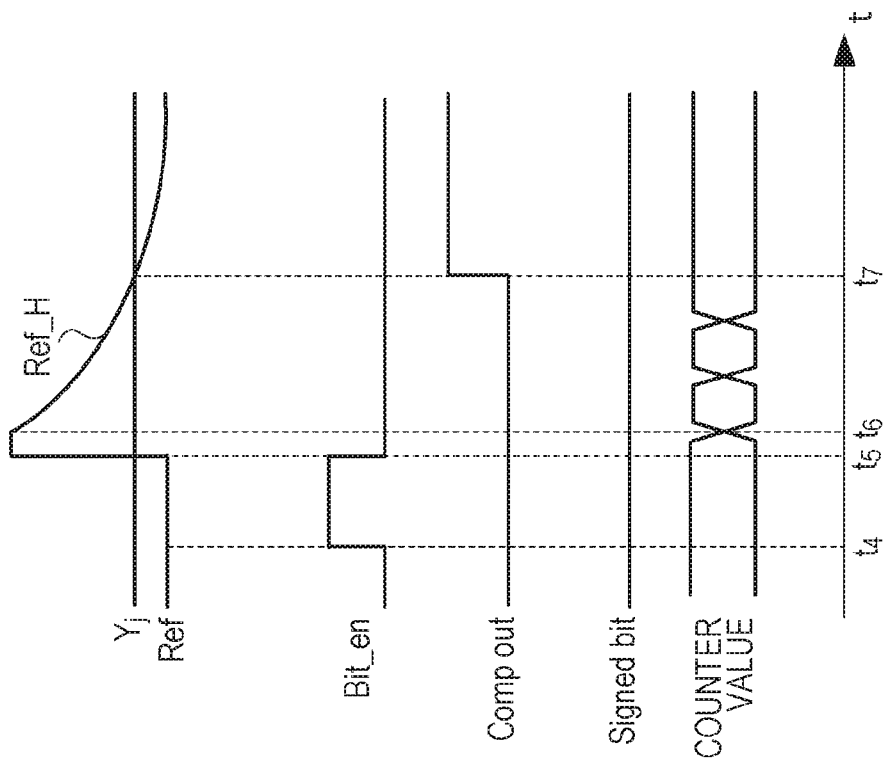

AD CONVERTER

CROSS-REFERENCE TO RELATED APPLICATIONS

This nonprovisional application claims priority from U.S. provisional patent application Ser. No. 62/782,642 filed on Dec. 20, 2018, the entirety of which is incorporated herein by reference.

BACKGROUND

Field

This disclosure relates to an A/D converter for Neuromorphic devices.

Description of the Related Art

In recent years, expectations for high speed and low power consumption technologies associated with a neural network are increasing, as demands for a recognition processing or a natural language processing are growing. However, a conventional processor architecture has problems of power and calculation speed due to that system requires data transfer between a memory and the processor when it performs learning and an inference processing for the neural network. In order to solve these problems, the neuromorphic device which has a memory in a processor is studied. The neuromorphic device which is proposed at patent document WO2019096660A1 has a Non-volatile memory inside the processor. This reduces not only the power consumption for data communication but also the area of device using a multi-bits memory architecture. In this approach, each layer calculates analog signals. A high speed and low power analog to digital converter (A/D converter) become necessary, when we implement digital circuits in a same chip.

SUMMARY

In order to satisfy these requirements, this patent proposes a low power and high speed A/D converter for neuromorphic device including analog and digital processing. An analog to digital converter is provided and includes column processing units that convert analog signal to digital signal; one or more counters counting time of analog to digital conversion; one or more comparators which compares the voltage of reference signal and analog signal from neuromorphic device; and one or more generators which generates reference signal for the comparator.

Further features of the present disclosure will become apparent from the following description of exemplary embodiments with reference to the attached drawings.

BRIEF DESCRIPTION OF THE DRAWINGS

FIG. 8A and FIG. 8B illustrate timing charts of A/D conversion of sign bit judgement.

DESCRIPTION OF THE EMBODIMENTS

First Embodiment

Figure 1:
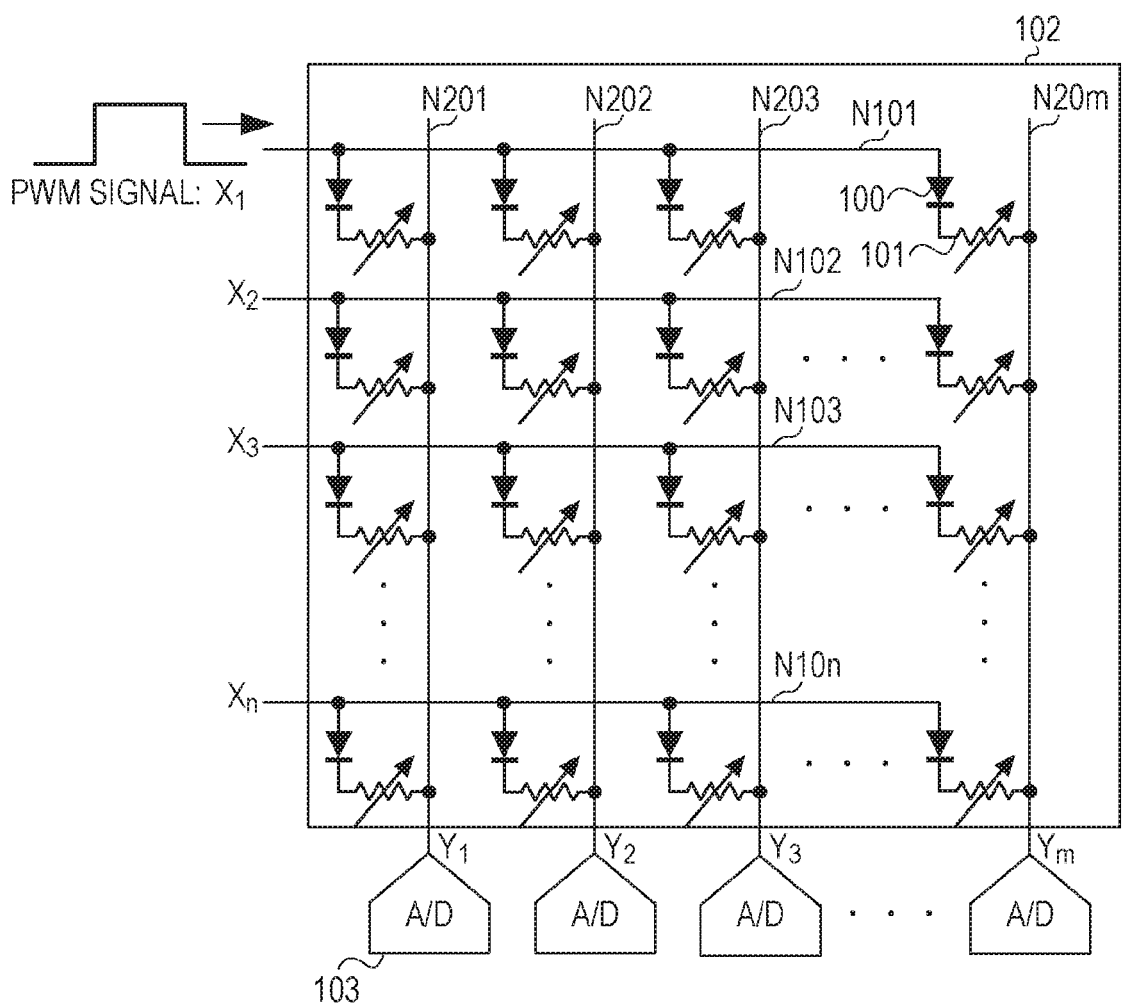
FIG. 1 shows a neuromorphic device array.

First of all, referring to FIG. 1, a description will be given of a schematic configuration of an analog neuromorphic device. In FIG. 1, the analog neuromorphic device has resistive elements 101 representing weights of neural network and diodes 100 or switches which control input signals. This example has variable resistances 101, but other memory devices such as MRAMs and SRAMs also can be used instead of variable resistances 101.

N101 is a horizontal electrical wire which sends PWM signal $X_1$. And N102, N103, N10$n$ are also horizontal electrical wires which send PWM signal $X_2$, $X_3$, $X_n$. N201 is a vertical electrical wire which sends currents of each multiplication results using the diodes 100 and the resistive elements 101. N202, N203 and N20$m$ are vertical electrical wires same as N201.

Resistive elements and diodes array 102 multiplies weights and input signals $(X_1, X_2, X_3, \ldots, X_n)$ and sums all results of the multiplications at the vertical electrical wires (N201, N202, N203 . . . N20$m$). Input signals of each array are Pulse Wave Modulated (PWM) signals whose pulse widths are representing the signal levels. The outputs of the array 102 which are analog signals are converted into digital signals at the A/D converter 103. This figure is drawn as full connected layer, but these calculation methods can be applied to a convolutional layer too. Then the outputs of multiplications are summed at vertical lines as analog signals. $Y_1, Y_2, Y_3, \ldots, Y_m$ are the outputs after multiply-add operations done by the PWM signals $(X_1, X_2, X_3, \ldots, X_n)$ and the variable resistances 101. This example uses diodes, so input signals are sent to node $X_1 \sim X_n$. But other methods such as inputting signal from gate node of switch device are also applicable instead of sending the signals to node $X_1 \sim X_1$ as long as analog outputs $Y_1, Y_2, Y_3, \ldots, Y_m$ can be calculated.

This is just only one example how to calculate the analog input signals, so not only pulse wave modulation (PWM) signals but also the other analog input signals such as amplitude modulation signals can be used with the proper input method which depends on an input signal type.

The outputs of multiply-add operations $Y_1, Y_2, Y_3, \ldots, Y_m$ are converted into digital signals by A/D converters 103 at each columns. In this figure, the case of full connected layers is shown as an example, but same A/D conversion approach is applicable for convolutional layers too.

Figure 2:
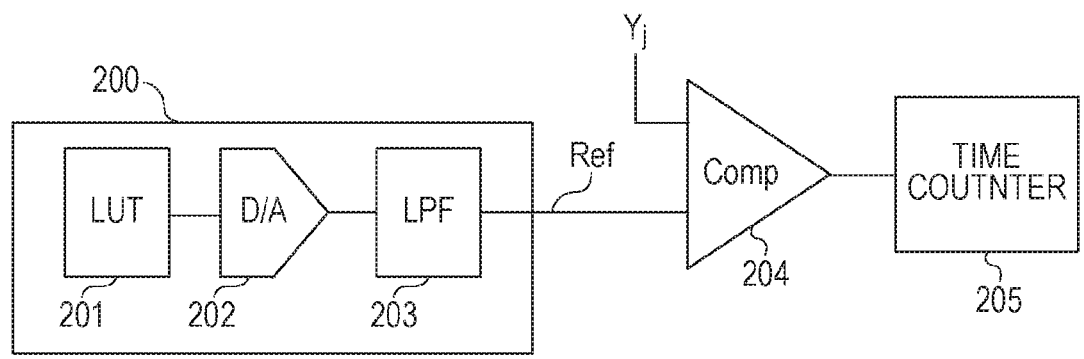
FIG. 2 shows an A/D convertor for the neuromorphic device array.
Figure 3:
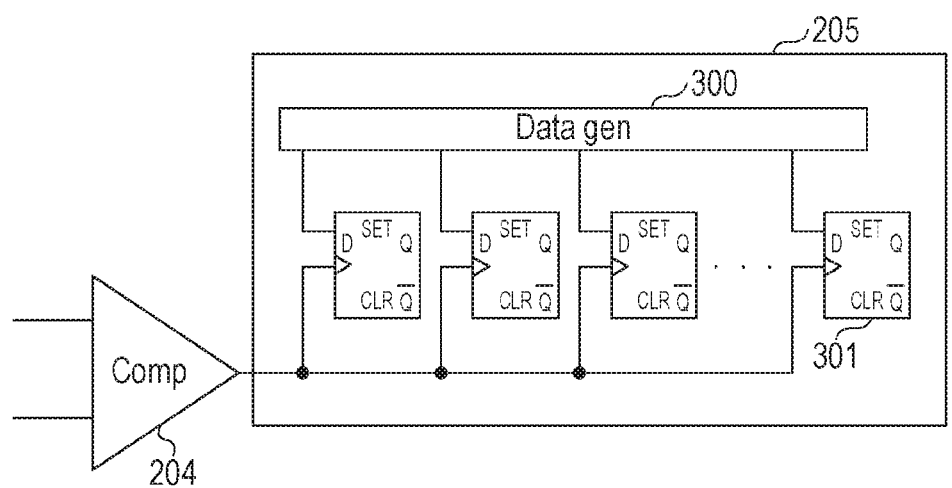
FIG. 3 shows an example of a counter circuit.

FIG. 2 shows the schematic of A/D converter. In this example, the A/D converter 103 comprises a lookup table (LUT) 201 which contains a non-linear and a linear function related to an activation function for a neural network such as hyperbolic tangent or sigmoid function. The A/D converter also includes a comparator 204 which compares the output of j th array $Y_j$ and a reference signal Ref which comes from a low pass filter (LPF) 203. The A/D converter 103 further includes a counter 205 which counts time from or until a time when the comparator's output of comparator 204 inverts. This example uses one comparator 204, counter 205 and DAC 200 per one neuromorphic device column. However, it should be understood that using two or more comparators, counters and DACs per one analog input signal can be applied too. This example uses a DAC and a LUT for generating reference signal (Ref), but other methods which can generate target signal are also applied. As long as the counter can count time, any method is applicable. For example, a memory which captures data relating to time or a counter such as ripple counter also can be used as a counter 205.

Figure 5:
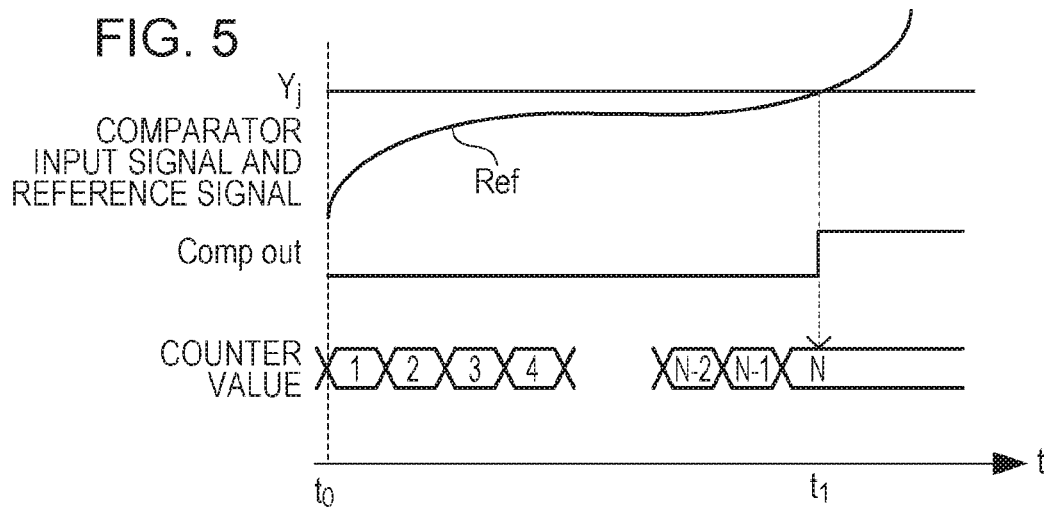
FIG. 5 shows an example of an A/D convertor's timing chart.

FIG. 5 shows a timing chart of an A/D converter which counts time from start time of A/D conversion to comparator inversion time. A/D conversion starts from $t_0$ and the comparator in the A/D convertor inverts the output at $t_1$. The counter counts the time from $t_0$ to $t_1$, and a reference signal of comparator Ref changes during A/D conversion. This reference signal is generated based on inverse functions of activation functions for neural network. The comparator inverts the output at $t_1$ when a magnitude of reference signal Ref become bigger than the output of array $Y_j$. Then the counter stores the counting value. This example uses a count up method, but any count methods may be used as long as that comparator's inversion timing is used because the conversion time can be calculated with the comparator inversion timing.

Figure 6:
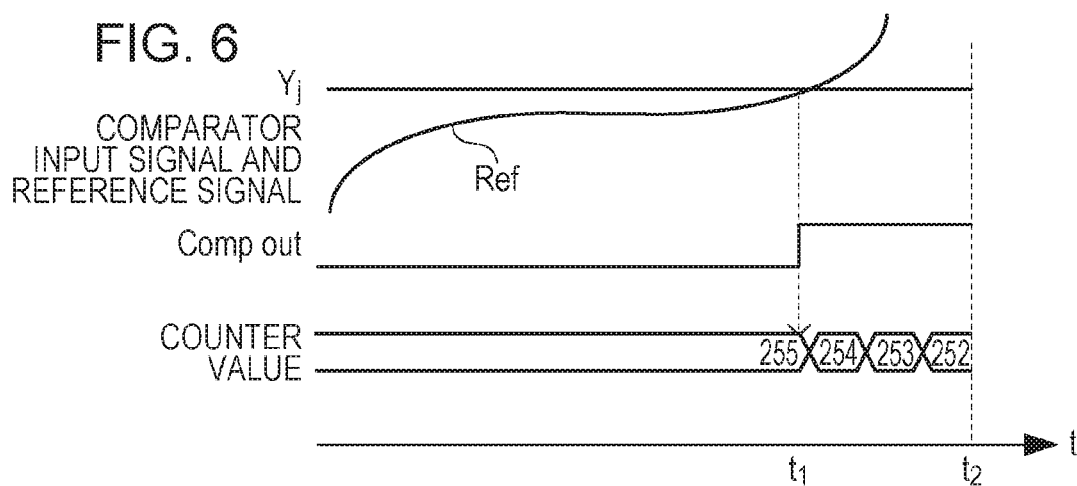
FIG. 6 shows an example of a timing chart of an A/D convertor which counts after comparator inversion time.

FIG. 6 shows the other example of counting time from the inversion of comparator to the end of A/D conversion. This example uses 8 bits A/D converter and down count value from $t_1$ to $t_2$ indicating that 252 is a final result of A/D converter. In this case $t_2$ time is fixed, so the equivalent value of FIG. 5 result can be obtained by using this count down method. As the above example shows, any method can be used as long as the method uses the comparator inversion timing.

Figure 7:
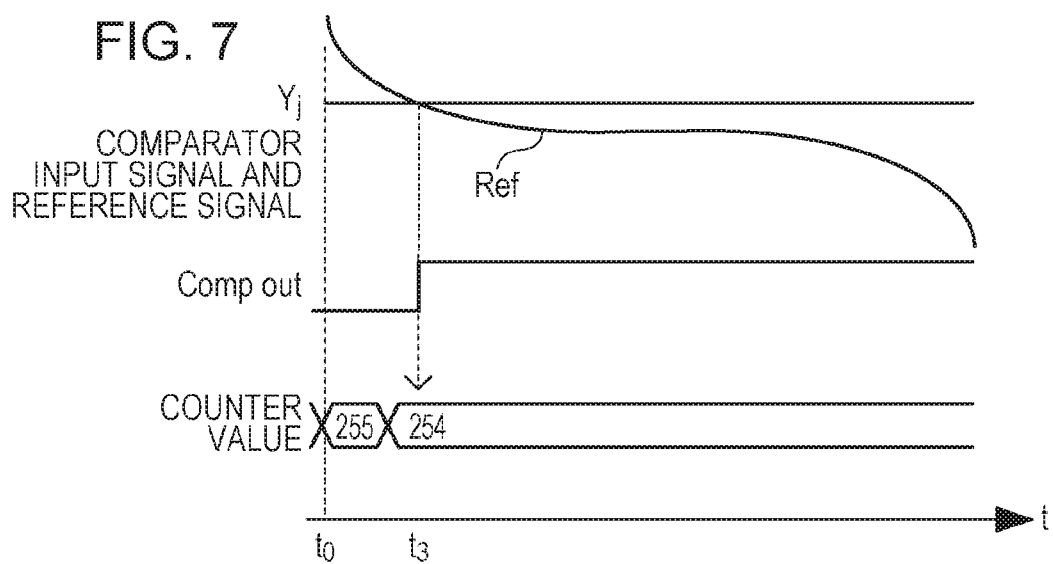
FIG. 7 shows an example of a timing chart of an A/D convertor with flipped reference signal.

FIG. 7 shows the example of the reference signal which is horizontally flipped inverse activation function. By using the flipped waveform as shown in FIG. 7, the higher input signal level is, the faster the timing of comparator inversion is in the A/D conversion. The A/D convertor sends the high level input result to the next processing step or to the next neural network layer. This example uses 8 bits A/D converter and the count value from $t_0$ to $t_3$. 254 is a final result of A/D converter. This example uses down count method from full count, but other methods such as count up from zero and subtracting the value from full scale are also applicable, as long as the calculation uses a comparator inversion timing.

Figure 9A:
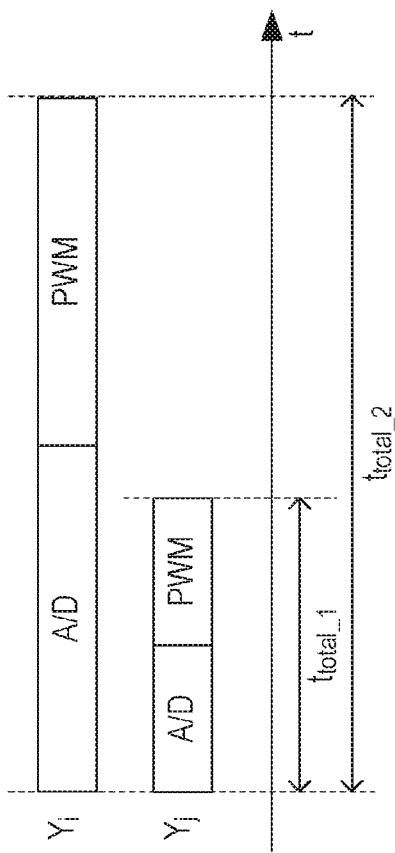
FIG. 9A and FIG. 9B are explanation figures of relation between A/D conversion time and PWM time.

FIG. 9A shows an example of a timing chart when A/D conversion time and PWM processing time are proportional to a certain input signal level which corresponds with FIG. 5 and FIG. 6. The period described as "A/D" is required time of A/D conversion which depends on the magnitude of analog input signal from the neuromorphic device column. The period described as "PWM" are the required time of generating PWM signal (data transfer) at next stage. This example assumes the PWM as the next process, but other operations can be applied as a next process too. In FIG. 9A, an example of high output level $Y_i$ of array 102 needs a longer time to reach at cross point between reference signal and input signal. The result is A/D conversion time become longer than the case of low output level. In addition, PWM generation time in next layer also takes a longer time to generate a long pulse. As a result of these process, neural network processing time $t_{total\_2}$ which includes A/D conversion and PWM generation becomes long. On the other hand, in FIG. 9A, $Y_j$ is an example of low level output of array 102. The A/D conversion time which is illustrated in FIG. 6 or FIG. 5 for low level output of array 102 is short. Because it reaches at cross point between reference signal and input signal soon after the time A/D conversion starts. As a result, A/D conversion time become shorter than the case of high level output such as $Y_i$ in FIG. 9A. In addition, PWM generation time in next layer also become shorter time to generate short pulse than the case of high level output like $Y_i$. As a result of these processes, neural network processing time $t_{total\_1}$ which includes A/D conversion and PWM generation becomes a shorter time. However, in order to operate next layer's process, the outputs of other columns are necessary, so faster columns have to wait for the finishing of the slowest column process. As a result, the case A/D conversion time become A/D conversion time and PWM generation time has proportional relation for a certain output level of array 102 (the case PWM generation time becomes longer when A/D conversion time becomes longer), it is difficult to make the calculation of a neural network faster.

Figure 9B:
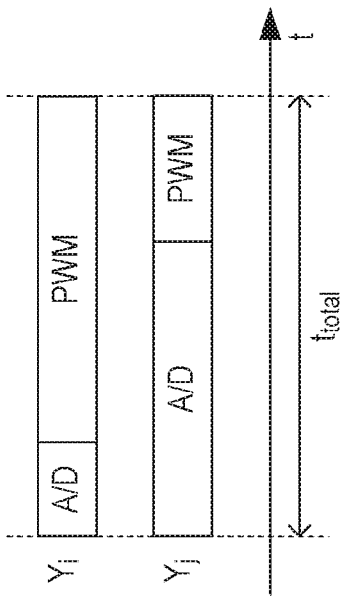

FIG. 9B is an example of timing chart when A/D conversion time and PWM generation time have inverse proportion relation which corresponds to FIG. 7. As shown in FIG. 7, to use reference signal Ref which moves from high level to low level makes an A/D conversion time for high input signal makes it shorter than the case of low input signal because the reference signal reaches a cross point earlier than shown in the cases illustrated in FIG. 5 or FIG. 6. On the other hand, PWM generation needs a longer time to generate long pulses when a high input signal comes. As shown in this example, when A/D conversion time and PWM generation time have inverse proportion relation for a certain signal level (the PWM generation time becomes shorter when A/D conversion time becomes longer), even in the case that a high input signal $Y_i$ comes, a total time of A/D conversion and PWM generation $t_{total}$ become faster than the case of FIG. 9A. As a result, in FIG. 9B, conversion time for low input signal $Y_j$ makes longer than the case of high input signal $Y_i$ because reference signal reaches at cross point later than FIG. 5 or FIG. 6 cases. On the other hand, PWM generation time becomes short because PWM generator generates a short pulse for a low level signal. As a result, the total time $t_{total}$ which includes A/D conversion time and PWM generation time is almost same as the case of $Y_i$ when inputs signal is high. In this method, total time becomes almost constant irrespective of the magnitude of the input signal and waiting time for other columns operation which is slower than others can be removed. As a point of view of total processing, it makes a total calculation time faster. Here, A/D converters 103 send each result independently when each columns finish the A/D conversion. But it is applicable to insert the other process between A/D conversion process and PWM generation process.

Second Embodiment

Figure 4:
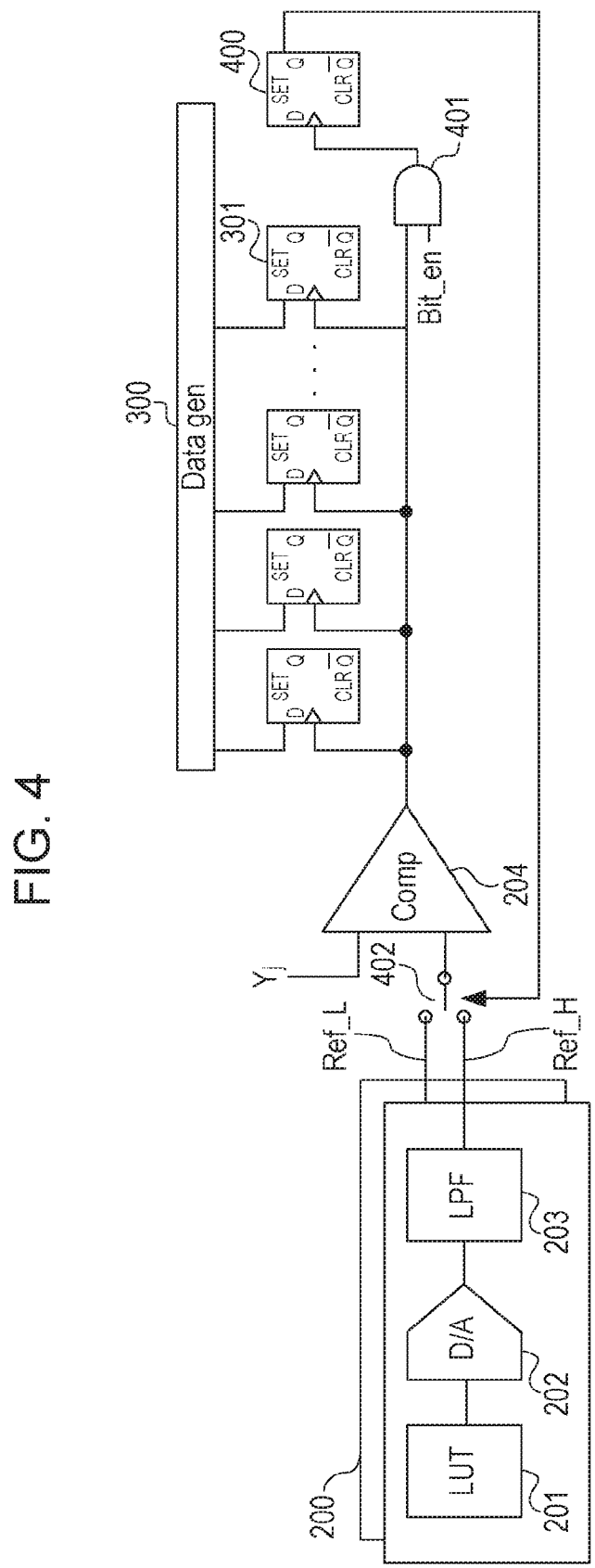
FIG. 4 shows an example of A/D convertor using multiple references.

FIG. 4 is a block diagram showing the configuration of the second embodiment. It is a configuration which adds a resister for sign bit 400 and a logic circuit which controls a write timing 401 of singed bit resister 400. In FIG. 4, AND gate 401 is used as an example of the logic circuit which controls a write timing, but the other logic circuit also can be used. FIG. 8A and FIG. 8B illustrate timing charts of this circuit. In FIG. 8A, reference signal Ref is set at a middle level of reference signal dynamic range at the time between $t_4$ and $t_5$ to check the sign bit result. Then comparator compares the two levels between the output of array $Y_j$ and the reference signal Ref_H. For example, in the case of tank is used as an activation function, the middle level of reference is around 0. Bit_en is set to Hi in order to activate the comparator output signal for the register 400 from $t_4$ to $t_5$. In other periods, Bit_en is set to Lo and masks the comparator output signal. The AND gate can be replaced by the other logic circuit which can mask the comparator output. At the time of $t_5$, the reference signal is switched based on the result of the judgement using median level. In the example of FIG. 8A, $Y_j$ level is higher than the reference signal Ref at $t_4$, so the comparator doesn't invert the output. Then at $t_5$, the reference signal Ref_H for Hi signal is selected depending on the result at $t_4$. On the other hand, in FIG. 8B, $Y_j$ level is lower than the middle level of the reference signal Ref at $t_4$ and comparator inverts the output. Then At $t_5$, reference signal Ref_L for the Lo signal is selected. Here, Ref_H is the horizontally flipped signal of inverse activation function and Ref_L is vertically flipped signal of Ref_H. Sending the result of the A/D conversion at each column when each column's A/D conversion finishes to the next processing stage, it is possible to shorten the total time which includes the time of next processing and the A/D conversion time.

Third Embodiment

Figure 10A:
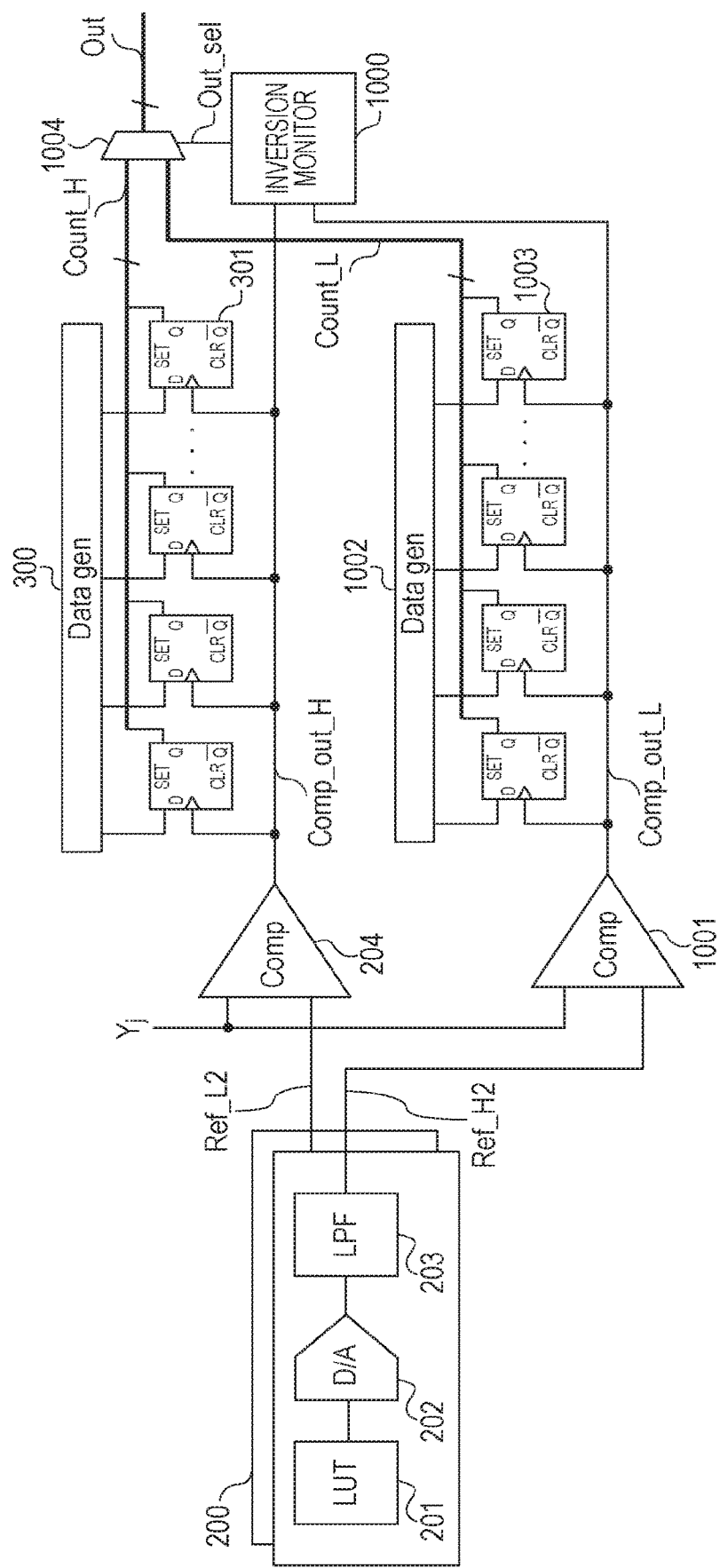
FIG. 10A and FIG. 10B show examples of an A/D convertor which has multiple comparators for one analog signal input.
Figure 10B:
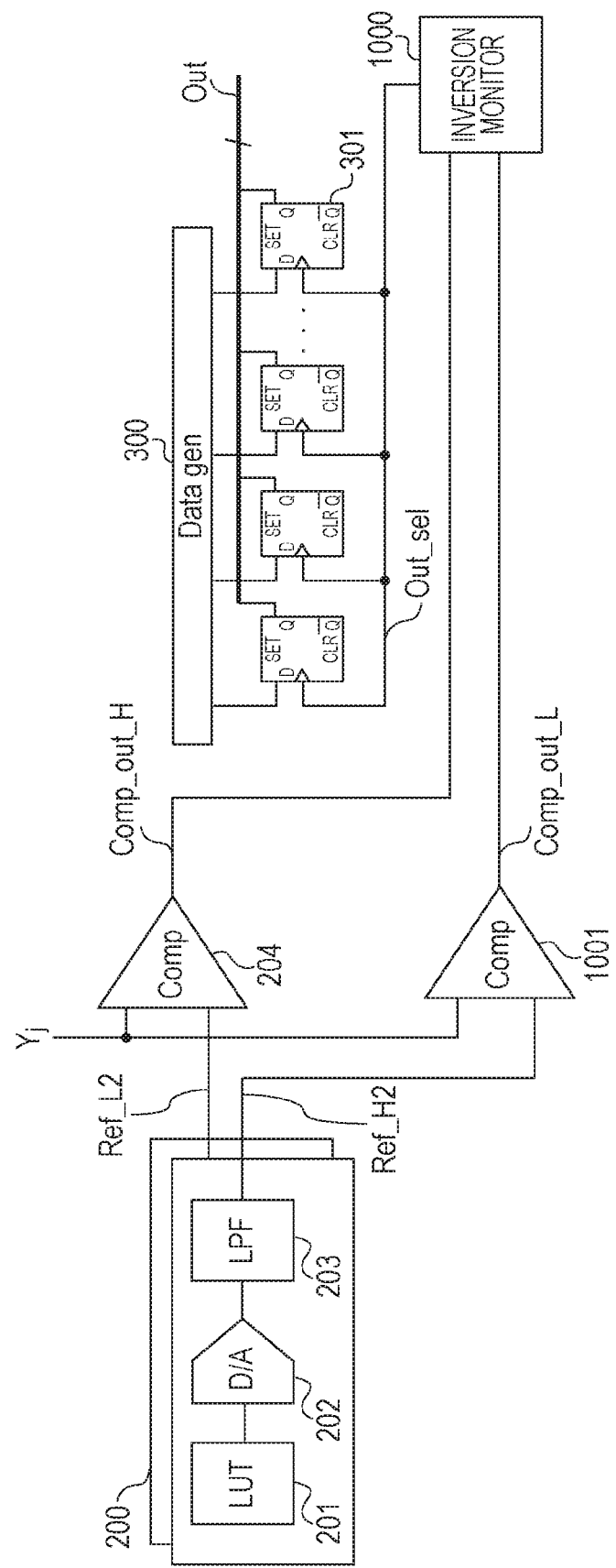
Figure 11:
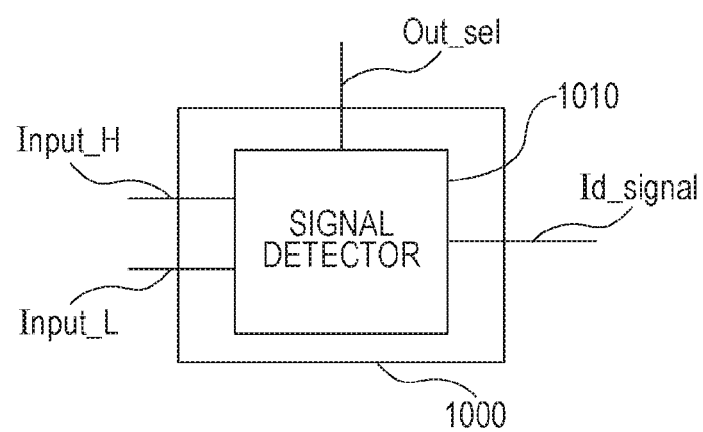
FIG. 11 shows an example of an inversion monitor.
Figure 12A:
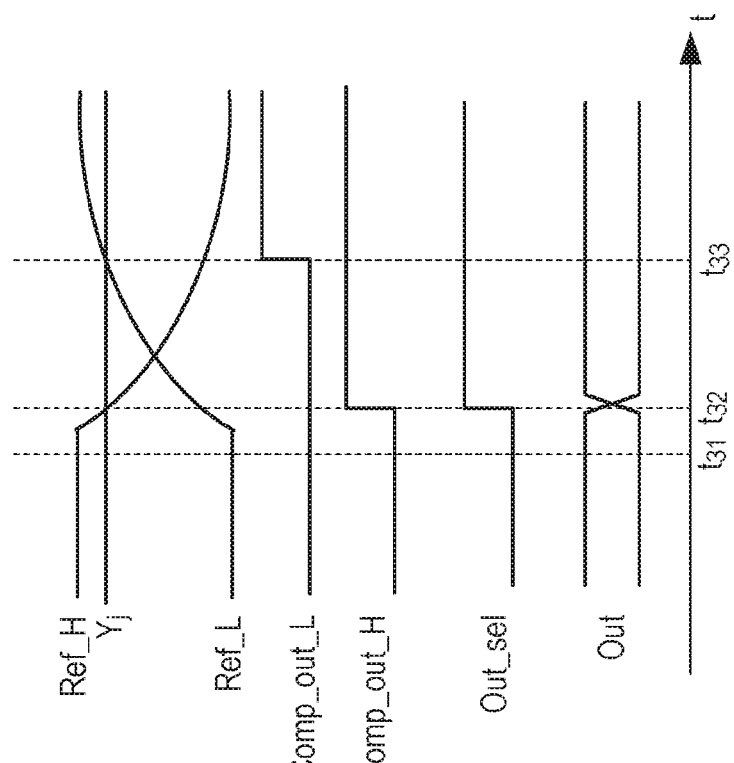
FIG. 12A and FIG. 12B show examples of a reference signal of multiple comparators architecture.
Figure 12B:
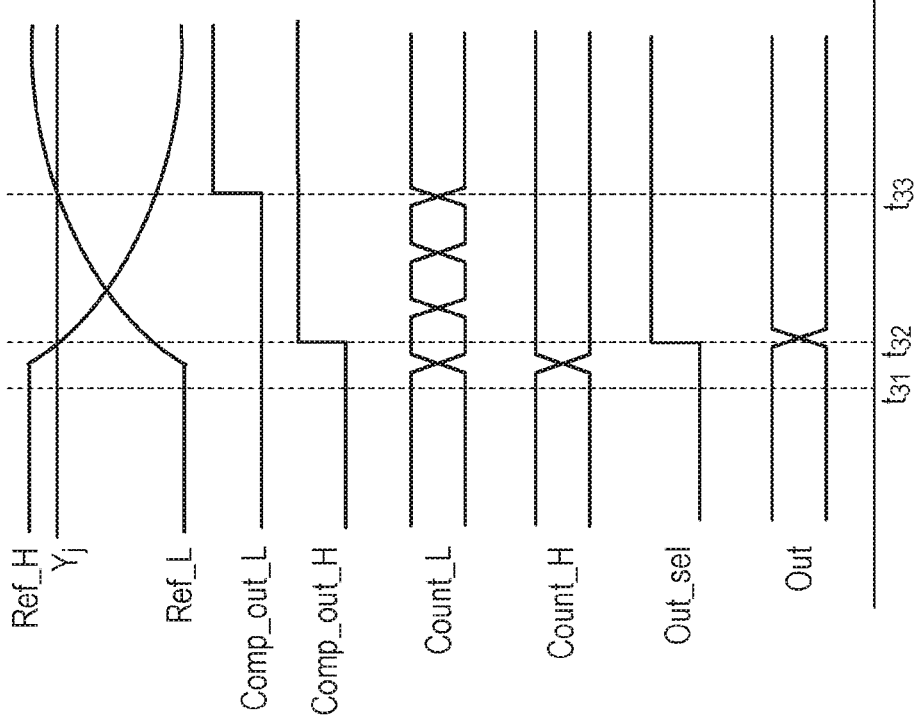

FIG. 10A and FIG. 10B show examples that has two or more comparators and reference signals per one column and shortens the A/D conversion time. FIG. 10A shows an example that has a counter per one comparator. In this figure, the comparator 204 uses a reference signal for a high level input and the comparator 1001 uses a reference signal for a low level input. About a signal path of reference signal for the high level, the conversion result is recorded as digital signal by flip-flop 301 and data generator 300 using time counts. Then that digital data goes to output selector 1004. The data path of reference signal for the low level is also processed in a same way. In this example, the comparator output using the high level reference signal Ref_H2 is named as Comp_out_H, the comparator output using the low level reference signal Ref_L2 is named as Comp_out_L, the A/D conversion result which uses Ref_H2 is Count_H, and the A/D conversion result which uses Ref_L2 is Count_L. The selector 1004 selects the output between Count_H and Count_L with a control signal from the inversion monitor 1000. The inversion monitor 1000 monitors the inversions of comparator outputs Comp_out_H and Comp_out_L and select the counter value which inverts first. Only the first conversion result is used as a final result, so another A/D conversion can be stopped after that one comparator inverts output for power saving. FIG. 12A is a timing chart of the A/D conversion in FIG. 10A. In this example, the input signal $Y_j$ is higher than middle level of the reference signal range. The A/D conversion starts at $t_{31}$ and the reference signal for high level Ref_H reaches at the same level of $Y_j$ at $t_{32}$. The comparator output Comp_out_H inverts at $t_{32}$ and the counter value count_H is fixed. Inversion monitor 1000 detect inversion of Comp_out_H and outputs the select signal Out_sel. Then Selector 1004 selects the output form Count_H as A/D conversion results. FIG. 10B shows the other example of the A/D conversion using two or more reference signals. FIG. 10B is a configuration which shares the counter between two comparators in FIG. 10A. A control signal Out_sel for counter circuits is generated after the output of comparator 204 or 1001 is inverted. FIG. 12B is a timing chart of FIG. 10B. As with FIG. 12A, $t_{31}$ is a start time of A/D conversion and $t_{32}$ is a time that reference signal for high level input Ref_H reach at the same level of A/D inputs $Y_j$. $t_{33}$ is a timing when a reference signal for low level input Ref_L crosses the input signal $Y_j$. After the time $t_{32}$ when either comparator inverts first, inversion monitor 1000 decides the Out_sel based on the comparator output. Then counter records the time of A/D conversion using a trigger signal based on Out_sel. In this example, the A/D conversion at low level side continues even after that another comparator inverted, but it is applicable to stop the other A/D conversion after that one of comparators inverted. FIG. 11 shows the function of the inversion monitor 1000. The inversion monitor 1000 has input nodes for comparator outputs Comp_out_H and Comp_out_L. Inversion Monitor 1000 monitors the output of both comparators, detects inversion signal, and judges which comparator is inverted first. Then it outputs a signal Id_signal which controls the selector.

What is claimed is:

1. An analog to digital converter which converts an analog signal output from a neuromorphic device comprising:
a counter counting time by a down counting method for analog to digital conversion;
a comparator which compares a voltage of a reference signal which is related to an inverse activation function for a neural network of the neuromorphic device and decreases over time with the analog signal output from the neuromorphic device and outputs a comparison result to the counter; and
a generator which generates the reference signal for the comparator,
wherein the counter keeps counting time until receiving the comparison result and generates a digital signal according to the counted time.

2. The analog to digital converter according to claim 1, further comprising one or more look up tables,
wherein the reference signal is generated by using the one or more look up tables.

3. The analog to digital converter according to claim 1, wherein the reference signal is related to inverse activation functions which include at least one of horizontally flipped function or vertically flipped function.

4. The analog to digital converter according to claim 1, wherein the comparator compares the analog signal with a median value of a plurality of signals included in the reference signal, and compares the analog signal with one of a plurality of signals included in the reference signal.

5. The analog to digital converter according to claim 1, further comprises a monitor which monitors the comparator outputs for a same analog input signal.

6. The analog to digital converter according to claim 1, wherein the A/D converter sends the A/D convertor output to a next processing unit in the order of the A/D conversion is completed.

7. The analog to digital converter according to claim 1, further comprises the neuromorphic device.

8. The analog to digital converter according to claim 3, wherein the reference signals which are related to the inverse activation functions includes the functions which are generated by flipping, cropping or both flipping and cropping the inverse activation function.

9. The analog to digital converter according to claim 1, wherein the inverse activation function is based on tanh.

* * * * *